United States Patent [19]

Moeller et al.

[11] Patent Number: 4,882,298
[45] Date of Patent: Nov. 21, 1989

[54] METHOD FOR ENCAPSULATING MICROELECTRONIC SEMICONDUCTOR AND THIN FILM DEVICES

[75] Inventors: Werner Moeller, Ulm; Andreas Ulmann, Lenningen, both of Fed. Rep. of Germany

[73] Assignee: Messerschmitt-Boelkow-Blohm GmbH, Munich, Fed. Rep. of Germany

[21] Appl. No.: 226,426

[22] Filed: Jul. 29, 1988

[30] Foreign Application Priority Data

Jul. 30, 1987 [DE] Fed. Rep. of Germany ....... 3725269

[51] Int. Cl.[4] ............................................. H01L 21/60
[52] U.S. Cl. ..................................... 437/212; 29/841; 29/850; 29/740; 228/904; 264/272.11
[58] Field of Search ................. 437/212; 29/842, 740, 29/850, 842; 228/904; 264/272.11

[56] References Cited

U.S. PATENT DOCUMENTS

| | | | |
|---|---|---|---|
| 3,608,029 | 9/1971 | Hough | 264/272.11 |
| 3,876,461 | 4/1975 | Flowers | 427/96 |
| 4,001,863 | 1/1977 | Kobayashi | 437/211 |
| 4,327,369 | 4/1982 | Kaplan | 264/272.11 |
| 4,388,132 | 6/1983 | Hoge et al. | 437/211 |

Primary Examiner—Brian E. Hearn
Assistant Examiner—Beverly A. Pawlikowski
Attorney, Agent, or Firm—W. G. Fasse; D. H. Kane, Jr.

[57] ABSTRACT

In a method for encapsulating microelectronic semiconductor and thin film devices, a reliable hermetically sealed encapsulation of the circuit components is achieved, even under long exposure to extreme environmental conditions of moisture and corrosive gases. A direct soldered connection and sealing of a metal foil capsule is achieved which is more reliable than glued capsules, and more economical than welded capsules.

17 Claims, 3 Drawing Sheets

METHOD FOR ENCAPSULATING MICROELECTRONIC SEMICONDUCTOR AND THIN FILM DEVICES

FIELD OF THE INVENTION

The invention relates to a method for encapsulating microelectronic devices including circuits, such as so-called chip and wire hybrid semiconductor circuits, microelectronic semiconductor components, such as so-called TABs (tape automated bonding). The components and/or circuits are mounted on a substrate, inside printed cermet rings welded, brazed or soldered together, then covered by a synthetic-metal composite film and finally encapsulated in a synthetic resin.

DESCRIPTION OF THE PRIOR ART

German Patent Publication (DE-OS) No. 3,442,131, corresponding to U.S. Ser. No. 909,118, now allowed, discloses a method of the general type described above, more specifically, a metal foil encapsulation method including a synthetic layer covering as a mechanical protective layer for microelectronic circuits especially for "chip and wire technology" circuits is disclosed in the reference. The known method is normally applied to electronic devices requiring a high reliability, because in the method attention is paid to achieving the highest possible reliability of the encapsulation or, in other words, the method aims to achieve a hermetically sealed cover or encapsulation of the device. Furthermore, it has been found that moisture and corrosive gases can still diffuse into the encapsulation if the encapsulated circuit is subjected to extreme environmental conditions for long periods of time. This diffusion leakage is due to a small joint gap which remains between the gas impermeable and tear resistant metal foil and the substrate after the metal foil is glued to the substrate. When moisture and corrosive gases diffuse or permeate through the joint gap they begin to adversely affect the semiconductor components, and especially cause corrosion at the contact locations.

OBJECTS OF THE INVENTION

In view of the foregoing it is the aim of the invention to achieve the following objects singly or in combination:

to avoid the above problems of the prior art, more specifically to achieve a hermetic soldered seal having a high reliability in all types of electronic devices including microelectronic circuits and components;

to maintain an effective hermetic seal of an encapsulating covering of a microelectronic circuit even under long term exposure to extremely harsh operating conditions including short term high temperature conditions; and to provide a soldering method for hermetically sealing and encapsulating electronic devices, especially microelectronic circuits and components, which method is simpler and more economical than welding closed housings for such devices as microelectronic circuits.

SUMMARY OF THE INVENTION

The invention starts with a device that has been conventionally secured to a ceramic substrate, which is screened with thick film inks. The substrate with different printings is conventionally heated to a temperature in the range of about 850° C. to 930° C. for burning out any binder material and for causing the ceramic finish firing. An insulating coating in the form of a collar is applied on the substrate, e.g. printed, onto the device during the last dielectric printing step at the specific locations, for example chip locations, which are to be encapsulated. The insulating coating or collar covers the conductor strips to which the semiconductor device has been bonded by means of bonding wires in a prior step. Next, a metal soldering paste such as a silver-palladium paste coating, or if copper conductor strips are used, a copper paste coating, having a thickness of approximately 50 to 150 $\mu$m is applied to the insulating collar. The metal paste coating forms a soldering aid. Thereafter, for the mounting of components, ICs etc., a layer of a metal foil, e.g. tinfoil, which has been coated with an insulating film such as polyethylene or which has been lacquered with a hard wax is stamp cut, deformed into proper capsule shape, and then placed over the semiconductor component or area to be encapsulated. Preferably, the capsule is placed by means of a vacuum lifting device. A heated capsule stamp which is, for example inductively heated, presses down the tinfoil capsule and solders it onto the silver-palladium or copper paste layer under a pressure within the range of about 1 to 5 bar at a temperature of about 250° C. for a time sufficient to assure a proper soldering. The insulating film on the metal foil has a thickness of about 3 to 50 $\mu$m, preferably 5 to 25 $\mu$m. The metal foil itself has a thickness of about 5 to 100 $\mu$m, preferably 25 to 50 $\mu$m. The insulating film may be applied to one or both sides of the metal foil. Care will be taken to leave the portion of the metal foil that will be soldered, free of the insulating film.

For microelectronic circuits such as, for example, integrated circuits (ICs) which can withstand temperatures of up to 400° C. for short periods of time, the intended soldering points are insulated by means of dielectric printing and are then burned in. After the chip and wire bonding, a silver glass soldering paste with an approximately 70% by weight silver content, is stamped onto the intended soldering locations. The silver glass solder is then heated or annealed at about 300° C. for approximately 15 minutes and then the metal foil cap or capsule is pressed lightly against the solder at the solder locations for approximately 30 minutes at 380° C., for example, in a pressing form or mold or die made of carbon such as graphite.

The heating necessary for achieving the soldering according to either embodiment of the method of the invention described above may be provided by electrical resistance heating, induction heating, or laser beam heating.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
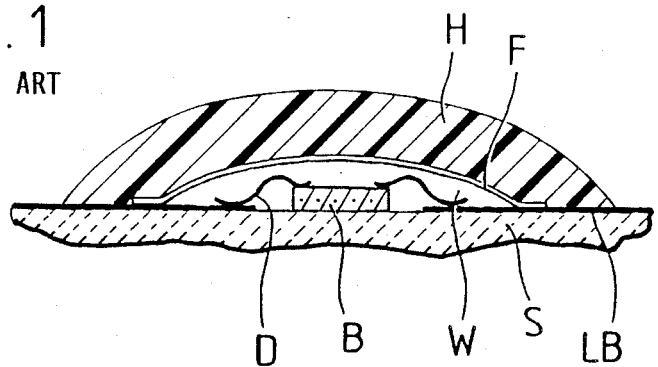
FIG. 1 is a schematic cross-sectional view of a semiconductor thin film circuit encapsulated according to the prior art.

FIG. 1 shows a conventionally encapsulated semiconductor device as described in the above mentioned prior art method using an adhesive bonding for securing a sealing metal-insulation composite foil to a substrate S and to the conductor path LB of an electronic component B mounted on the substrate S and electrically bonded via bonding wires D to the conductor path or strips LB on the surface of the substrate S. This arrangement is covered by a metal composite foil F which is then pressed onto the soft layer W by means of a heated hollow stamp which is not shown. After soldering or welding or brazing of the foil the entire encapsulating arrangement is coated with an epoxy resin H which is poured over the arrangement.

Figure 1A:
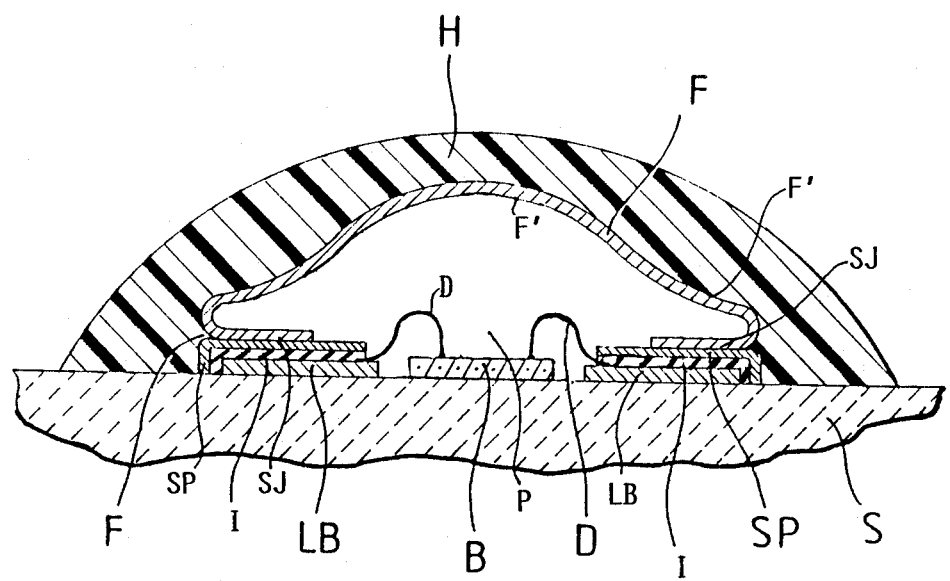
FIG. 1a is a similar schematic cross-sectional view, but of a microelectronic semiconductor thin film circuit encapsulated according to the soldering method of the invention.

FIG. 1a shows a semiconductor circuit component B which has been encapsulated by the method according to the invention. The component B is, e.g., a microelectronic thin film circuit component B mounted on the ceramic substrate S and electrically bonded to bonding wires D connecting the component B to conductor strips or path LB also secured to the substrate S in conventional ways. The ceramic substrate is also formed by conventional ways. During a final dielectric printing step the areas of the circuit arrangement which are to be encapsulated, for example, the area of each semiconductor chip or, as shown, the conductor path LB, is print coated with an insulating ring I which covers and insulates the conductor strips or path LB around the area to be encapsulated. Then, the insulating ring I is coated with a metal paste SP acting as a soldering aid. The metal paste SP is, e.g. a silver-palladium coating, or if copper conductor strips LB are used, a copper paste coating SP of approximately 50 to 150 μm thickness. Annealing of the binder and burning-in or firing of the ceramic of the substrate are carried out conventionally as is typical at 850° C. and 930° C. respectively. In case a copper paste coating SP is applied even prior to the securing of the component B, the just mentioned heat treatments should be carried out in a slightly reducing protective gas or forming gas atmosphere.

A metal foil F having a thickness of 5 to 100 μm, preferably 50 μm which is to be used for encapsulating the microelectronic circuit or component B is coated on at least one side, or on both sides, for example, with an insulating film F', e.g. of polyethylene with a thickness within the range of about 3 μm to 50 μm, preferably 5 to 25 μm. The metal foil F may, for example, be a tin foil or a copper foil or, as described in detail below, a chrome-nickel-steel foil. The insulating film F' will not cover that portion of the foil F which will contact the metal paste SP to assure a good soldering joint SJ.

The metal foil F is stamp cut to the proper size, deformed into the appropriate capsule shape, and placed as a cap over the bonded integrated or hybrid circuit component B, for example by means of a vacuum or suction pick-up device, which is not shown in detail. The foil capsule F is then pressed against the metal paste layer SP of silver-palladium or copper layer or the like, by a heated hollow stamp and soldered into place at a pressure of about 1 to 5 bar at a temperature of approximately 250° C. with a tolerance of ±30° C., depending on the pressure and on the solder type.

Figure 2A:
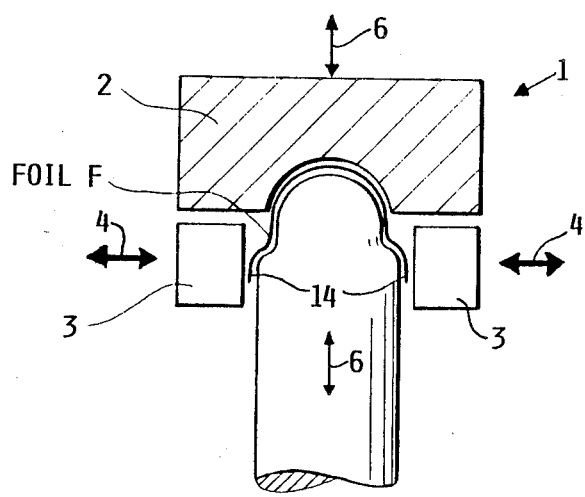
FIG. 2a is a schematic side view in partial section, showing a first forming tool carrying out the initial forming of a capsule foil.
Figure 2B:
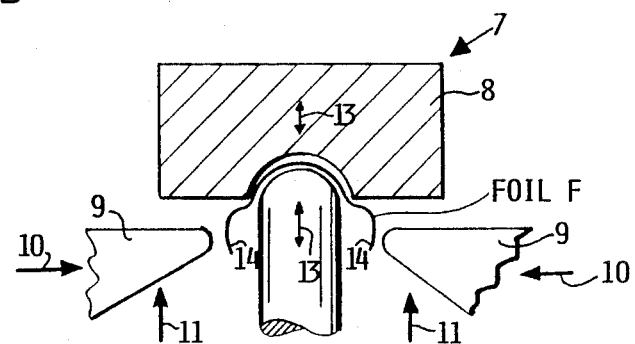
FIG. 2b is a similar schematic side view in partial section of a second forming tool forming a flange or bead rim around the pre-formed foil capsule.
Figure 2C:
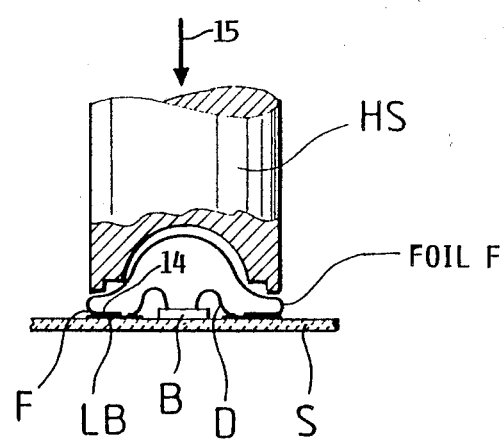
FIG. 2c is a side view in partial section showing the foil capsule being stamp soldered onto the microelectronic circuit component, with the aid of a soldering stamp tool.

In order to achieve the soldering a sleeve type soldering stamp HS shown in FIG. 2c may utilize an inductive heating effect or a resistive heating effect, or may include a laser such as a YAG-Nd laser for heating the area of the soldered joint SJ. The polyethylene coating or hard wax coating of the metal foil F also insulates the bonding wires D and the circuit component B from the metal foil F. In the case of a copper foil F a surface oxidation of the other facilitates a transformation reaction and thereby improves the bonding of the metal foil F to the ceramic of the substrate S through the coating SP.

As mentioned above, a chrome-nickel-steel foil may also be used as the capsule foil F. In this case the trimmed chrome-nickel-steel foil F is coated on one side with a polyester, for example PETP and is cold formed and edge beaded into the appropriate capsule shape. In order to improve the insulation of the circuit component B, especially when using a YAG-Nd laser with a low power output in a de-focussed condition for the soldering with only a light soldering pressure, a drop of silicone P may be applied to the surface of the semiconductor component B before the metal foil cap F is applied. The cermet rings on the substrate and the ring of the cap should have cleaned, trimmed surfaces without organic materials.

The sequence of steps of the method according to the invention is shown schematically in FIGS. 2a, 2b, and 2c. FIG. 2a shows a first forming tool 1 having a main die 2 and lateral forming jaws 3 movable in the direction of the arrows 4 for forming the metal foil F into its primary capsule shape. The main or forming die 2 cooperates with a further forming stamp 5. The die 2 and stamp 5 are driven axially together or individually according to the pair of arrows 6 to give the foil F a dome shape while the forming jaws 3 close radially onto the forming stamp 5 according to the pair of arrows 4 to form an outer rim 14 of the foil F which will later be beaded over or flanged over as shown in FIGS. 2b and 2c.

In FIG. 2b, a second forming tool 7 includes an upper forming die 8 and a lower forming stamp 12 which are driven axially together according to the pair of arrows 13 to give the foil F its final capsule shape. Forming jaws 9 first move radially inwardly according to the arrows 10 to bead over a rim of the foil capsule F and then move toward the die 8 to form the beaded soldering flange 14 of the foil capsule F as shown by the arrows 11.

As shown in FIG. 2c, the foil capsule F has been placed as a cap over the circuit component B, for example, by means of a vacuum carrying device not shown, but forming part of the sleeve type soldering stamp HS which is now ready to be pressed in the direction of arrow 15. The soldering stamp HS is heated to achieve the soldering. Various types of heating may be used as described above. The stamp soldering is carried out at a pressure of about 1 to 5 bar and, for example, with a 10 KA resistive heating provided by the heated stamp HS. Alternatively, as described above, a laser may be used to achieve the hermetic solder sealing along the solder joints SJ in which case the circuit component B may additionally be insulated by a drop of silicone P applied to its surface prior to the soldering. After the metal foil cap F is hermetically soldered and sealed along the solder joint SJ the encapsulated component is coated and further sealed or embedded in a filled epoxy resin H which is applied in a pour coating step and then cured to result in the finished encapsulated microelectronic component as shown in FIG. 1a and described above.

The method according to the invention may be adapted slightly for microelectronic circuits, especially ICs which can withstand temperatures up to 400° C. for a short period of time. Just as described above, the areas of the circuit which are to be hermetically solder sealed or encapsulated according to the method of the invention, each include, for example, an IC component B electrically bonded by bonding wires D to conductor strips or path LB all arranged on a substrate S. The areas to be encapsulated are then insulated by a ceramic layer I and appropriately burned in. Then, a silver glass soldering compound SP with a silver content of approximately 70% by weight is stamped onto the appropriate areas to be soldered and is then annealed at approximately 300° C. for approximately 15 minutes. Then, the preformed metal foil cap F is soldered into place onto the metal paste soldering compound SP at 380° C. for maximally 30 minutes with a light soldering pressure, for example in a carbon or graphite form or mold or die. Alternatively, instead of the silver glass soldering paste lower melting temperature glass-metal pastes, copper-thick-layer pastes, or silver-palladium pastes may be used. In order to insulate the bonding wires D and the circuit or components B, a so-called conformal coating of heat resistant non-gasing high purity silicone resin may be applied. The metal foil F is in this instance 5 to 100 μm thick and is made of Cu, Sn, or Al, for example, and may be insulated or coated on one or two surfaces with a synthetic film F', such as PE or PETP, or with a hard wax, or with PI coating, or the like. This insulating coating layer preferably has a layer thickness of 3 to 50 μm. Heating for achieving the soldering may be provided by a laser of low power and a weak focus, for example, a YAG-Nd-laser. Alternatively, the soldering may be carried out as a contact soldering, inducting soldering, or resistive soldering with a heated stamp of the appropriate shape, especially for copper coated ceramic substrates and Sn foils, Cu foils, or Al foils which are provided with a silver-palladium coating.

Although the invention has been described with reference to specific example embodiments, it will be appreciated, that it is intended to cover all modifications and equivalents within the scope of the appended claims.

What we claim is:
1. A method for encapsulating a microelectronic semiconductor device comprising the following steps:
   (a) securing said semiconductor device on a substrate,
   (b) electrically connecting said semiconductor device through bonded wires (D) to conducting strips (LB) on said substrate
   (c) applying an insulating collar (I) on said conducting strips (LB) to cover said conducting strips at least in an area to be encapsulated,
   (d) applying a soldering binder layer (SP) about 50 to 150 μm thick to cover said insulating collar (I),
   (e) coating a metal foil (F) on at least one side with an insulating coating (F'),
   (f) cutting a capsule blank from said coated metal foil with a shape and size appropriate for said area to be encapsulated,
   (g) forming said capsule blank into a domed capsule, said forming providing said domed capsule with a beaded soldering flange (14).
   (h) placing said domed capsule over said semiconductor component at said area to be encapsulated, so that said beaded soldering flange contacts said soldering binder layer (SP), and
   (i) stamp soldering said soldering flange by applying a pressure within the range of about 1 to 5 bar at a temperature within the range of about 220° C. to about 280° C. for forming a hermetic seal between said soldering binder layer (SP) and said soldering flange of said domed capsule.

2. The method of claim 1, wherein said soldering binder layer (SP) is applied as a silver-palladium paste layer.

3. The method of claim 1, wherein said conducting strips (LB) are copper strips, and wherein said soldering binding layer is applied as a copper paste layer.

4. The method of claim 1, wherein said insulating collar is applied by a dielectric printing step.

5. The method of claim 1, wherein said placing step is performed with the aid of suction lifting means.

6. The method of claim 1, further comprising coating said semiconductor device with a drop of silicone prior to said placing step.

7. The method of claim 1, wherein said metal foil (F) is selected to have a thickness of 5 to 100 μm, preferably 50 μm, and said insulating coating (F') on said metal foil (F) is selected to have a thickness of 3 to 50 μm, preferably 5 to 25 μm.

8. The method of claim 1, wherein said metal foil (F) is made of a material selected from the group consisting of tin, copper, aluminum, and chrome-nickel-steel.

9. The method of claim 1, wherein said insulating coating is selected from the group consisting of polyethylene, PETP, a lacquer, a hard wax, and a PI coating.

10. The method of claim 1, wherein said soldering binder is selected from a group consisting of silver-palladium paste, a copper paste, a tin lead soldering paste, and a low melting-temperature glass-metal paste, and a silver-glass paste.

11. The method of claim 1, wherein said stamp soldering step comprises die stamping and resistive heating.

12. The method of claim 1, wherein said stamp soldering step comprises die stamping and inductive heating.

13. The method of claim 1, wherein said stamp soldering step comprises die stamping and laser beam heating.

14. The method of claim 13, wherein said laser beam heating is achieved with a low-power YAG-Nd laser in a soft defocussed state and temperature-controlled.

15. The method of claim 1, wherein said soldering flange is directly heated during said stamp soldering step.

16. The method of claim 1, wherein said semiconductor device is a component which can withstand a temperature of 400° C. for a short time, using as said soldering binder a silver-glass solder paste having a silver content of approximately 70% by weight performing an intermediate heating step at about 300° C. for about 15 minutes for baking, performing said placing step, and then performing said stamp soldering step at a temperature of about 380° C. for about 30 minutes.

17. The method of claim 16, further comprising using a graphite die for performing said intermediate heating step and said stamp soldering step.

* * * * *